(12) United States Patent
Liu et al.

(10) Patent No.: US 9,007,328 B2
(45) Date of Patent: Apr. 14, 2015

(54) DISPLAY WITH IMPROVED BENDABLE COVER HAVING LIGHT TRANSMISSIVE AREA

(71) Applicant: AU Optronics Corp., Hsinchu (TW)

(72) Inventors: Kang Chung Liu, Hsinchu (TW); You Min Wang, Hsinchu (TW); Wen Min Hsu, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 14/177,428

(22) Filed: Feb. 11, 2014

(65) Prior Publication Data

US 2014/0160690 A1    Jun. 12, 2014

Related U.S. Application Data

(62) Division of application No. 13/174,994, filed on Jul. 1, 2011, now Pat. No. 8,686,973.

(30) Foreign Application Priority Data

Dec. 30, 2010    (TW) ................. 99147010 A

(51) Int. Cl.
G06F 3/041    (2006.01)
H05K 5/03    (2006.01)
G06F 1/16    (2006.01)

(52) U.S. Cl.
CPC ............. H05K 5/03 (2013.01); G06F 1/1637 (2013.01); *Y10S 345/905* (2013.01)

(58) Field of Classification Search
CPC ...................................... G06F 3/0412

USPC ............. 345/173–175, 905; 349/58–60
See application file for complete search history.

(56) References Cited

U.S. PATENT DOCUMENTS

| | | | |
|---|---|---|---|
| 6,152,550 | A | 11/2000 | Yamaguchi |
| 2007/0132907 | A1 | 6/2007 | Kim |
| 2007/0159474 | A1* | 7/2007 | Takagi et al. .......... 345/204 |

FOREIGN PATENT DOCUMENTS

| | | |
|---|---|---|
| CN | 1543277 | 11/2004 |
| CN | 2807333 | 8/2006 |
| CN | 1983458 | 6/2007 |
| CN | 101245226 | 8/2008 |
| CN | 101445708 | 6/2009 |
| CN | 101598860 | 12/2009 |
| CN | 101598861 | 12/2009 |
| CN | 101610634 | 12/2009 |
| CN | 101840083 | 9/2010 |
| JP | 4074349 | 4/2008 |
| TW | M323652 | 12/2007 |

* cited by examiner

*Primary Examiner* — Joseph Feild
*Assistant Examiner* — Gustavo Polo
(74) *Attorney, Agent, or Firm* — WPAT, PC; Justin King

(57) ABSTRACT

A display is provided. The display includes a frame, a display module, and a bendable cover. The frame includes a bottom surface and a lateral surface, the display module is disposed on the frame, and the bendable cover has a surface layer and an adhesive layer, the adhesive layer is located on the surface layer, a part of the surface layer is adhered to the display module through the adhesive layer, another part of the surface layer is attached to the lateral surface of the frame and adhered to the bottom surface of the frame through the adhesive layer.

12 Claims, 11 Drawing Sheets

DISPLAY WITH IMPROVED BENDABLE COVER HAVING LIGHT TRANSMISSIVE AREA

CROSS-REFERENCES TO RELATED APPLICATIONS

This application is a divisional application of U.S. patent application Ser. No. 13/174,994, file on Jul. 1, 2011. This non-provisional application claims priority under 35 U.S.C. §119(a) on Patent Application No. 99147010 filed in Taiwan, R.O.C. on 2010 Dec. 30, the entire contents of which are hereby incorporated by reference.

BACKGROUND

1. Technical Field

The disclosure relates to a display structure, and more particularly to a display structure using a bendable cover to replace a conventional display structure with upper and lower metallic shells.

2. Related Art

With the rapid development of science and technology, technology changes and develops on a daily basis, the use of a mobile electronic device is closely related to human life; examples include a mobile phone or a tablet computer, which are ubiquitous in modern society.

Many kinds of electronic devices which need to acquire and display information can only be read by the user through display of an information picture with a display of an electronic device. Currently, a display of a commercially available electronic device is usually implemented in a combination manner using a sandwich structure. As FIG. 1 shows, in a conventional display a panel A2 is sandwiched between an upper metallic shell A1 and a lower metallic shell A3, that is, the panel A2 is fixed by the upper metallic shell A1 and the lower metallic shell A3.

In the prior art, when a display is completely assembled in the manner of sandwiching the panel A2 between the upper metallic shell A1 and the lower metallic shell A3, the thickness and width thereof are increased obviously, contrary to the current trend of reducing the thickness of electronic devices, and preventing the device from being made both small and thin.

Furthermore, most of the upper metallic shells A1 and the lower metallic shells A3 are made of metal, which not only increases a material cost but also increases the weight of the electronic device; in addition, assembly relies on manual operation, consuming substantial time and labor. Another disadvantage of this assembly method is that a gap exists between the metallic shell and the panel, such that external dust or water vapor easily enters the electronic device, endangering it.

The need to simplify the composition structure of the panel, improve the convenience of the assembly, and achieve cost reduction and thinness, is therefore urgent.

SUMMARY

Accordingly, the disclosure is directed to a display including a frame, a display module, and a bendable cover. The frame includes a bottom surface and a lateral surface, the display module is disposed on the frame, the bendable cover has a surface layer and an adhesive layer, the adhesive layer is located on the surface layer, a part of the surface layer is adhered to the display module through the adhesive layer, and another part of the surface layer is attached to the lateral surface of the frame and adhered to the bottom surface of the frame through the adhesive layer.

In an embodiment, a display includes a light-guiding element, a display module, and a bendable cover. The light-guiding element includes a bearing portion, a sidewall, and a bottom surface, in which the sidewall has a lateral surface adjacent to the bearing portion. The display module is disposed on the bearing portion. The bendable cover includes a surface layer and an adhesive layer, the surface layer has a light transmissive area, the adhesive layer is located on the surface layer, a part of the surface layer is adhered to the bottom surface of the light-guiding element through the adhesive layer, and another part of the surface layer is attached to the lateral surface of the light-guiding element and adhered to the display module through the adhesive layer. The light-guiding element and the display module are sandwiched between the bendable cover, and the light transmissive area is located on the sidewall. Furthermore, the light-guiding element guides a light to the light transmissive area of the bendable cover.

According to the disclosure, the bendable cover replaces the conventional upper and lower metallic shell structure, reducing material cost, display size, and weight. Furthermore, according to another embodiment the process of attaching to the bendable cover may be performed using automatic equipment, effectively reducing manual assembly time. Moreover, the bendable cover is adhered tightly to the display module, reducing the probability oft external dust and water vapor entering the display. According to another embodiment, the conventional frame is integrated with a light-guiding plate to form the light-guiding element, the light transmissive area is disposed on the bendable cover, and a light ray is guided to the light transmissive area of the bendable cover through the light-guiding element, simplifying the display structure, and a mold opening cost of the frame and a product cost are further saved.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
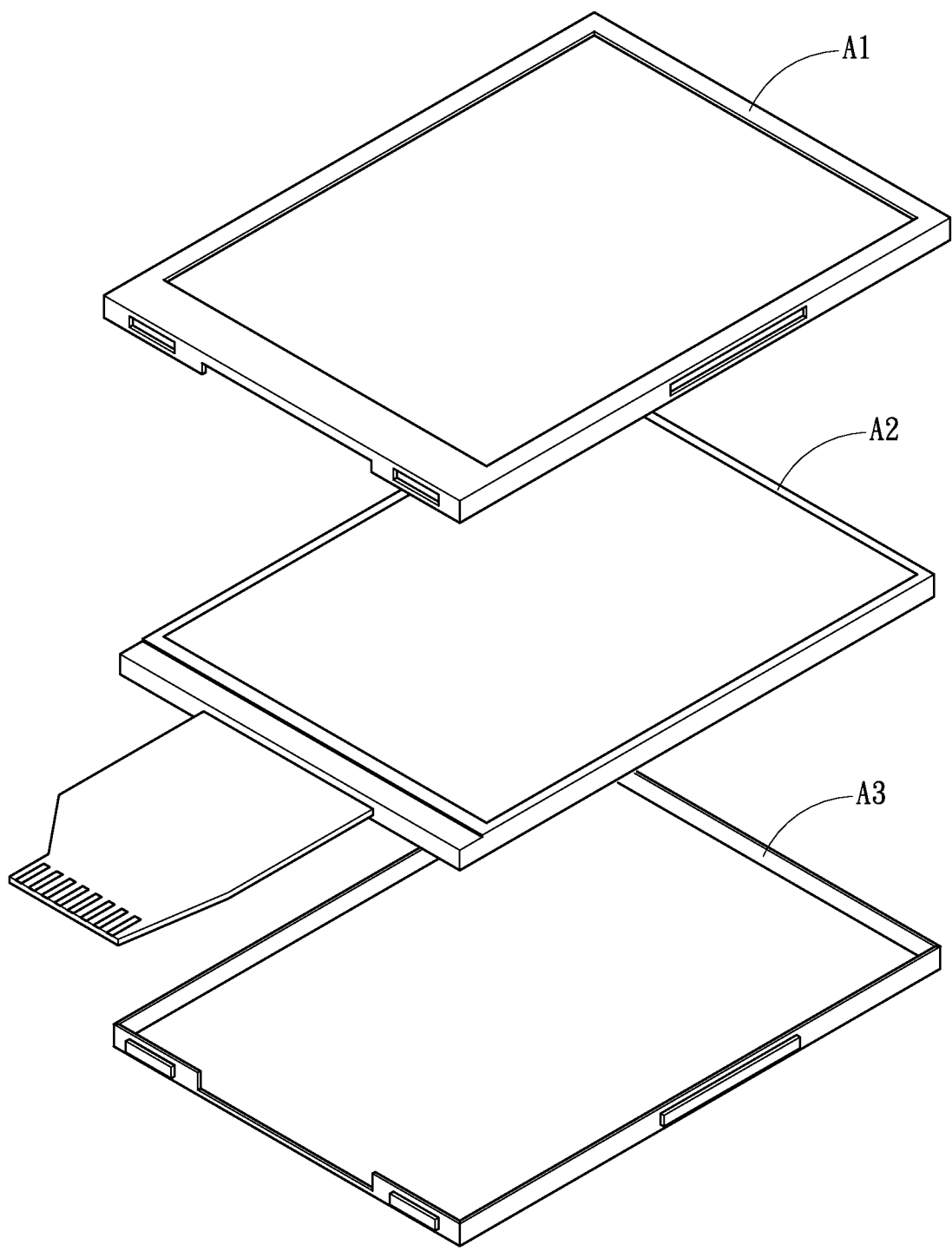
FIG. 1 is a schematic appearance view in the prior art.
Figure 2:
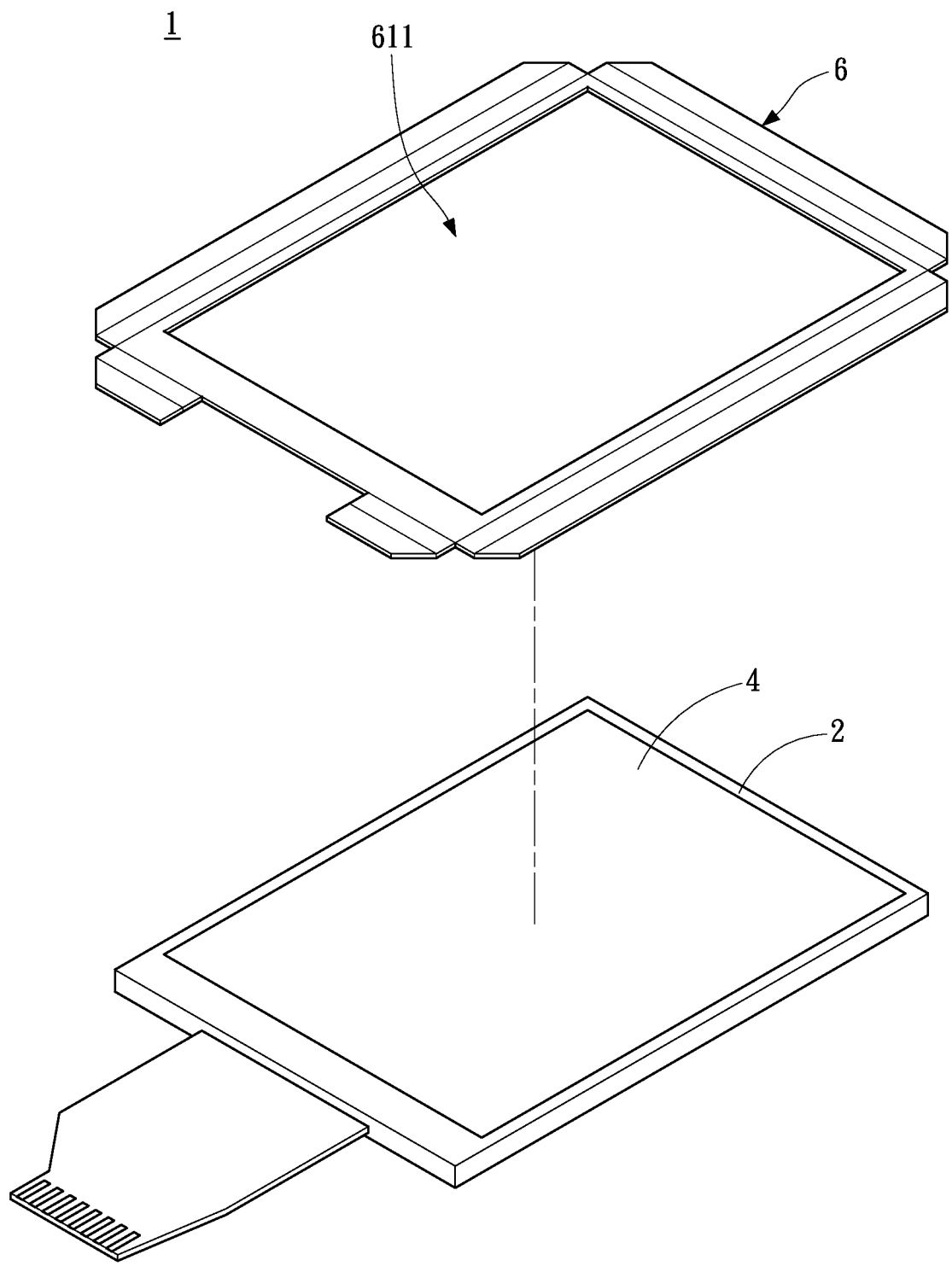
FIG. 2 is a schematic appearance view before assembly according to a first embodiment.
Figure 3:
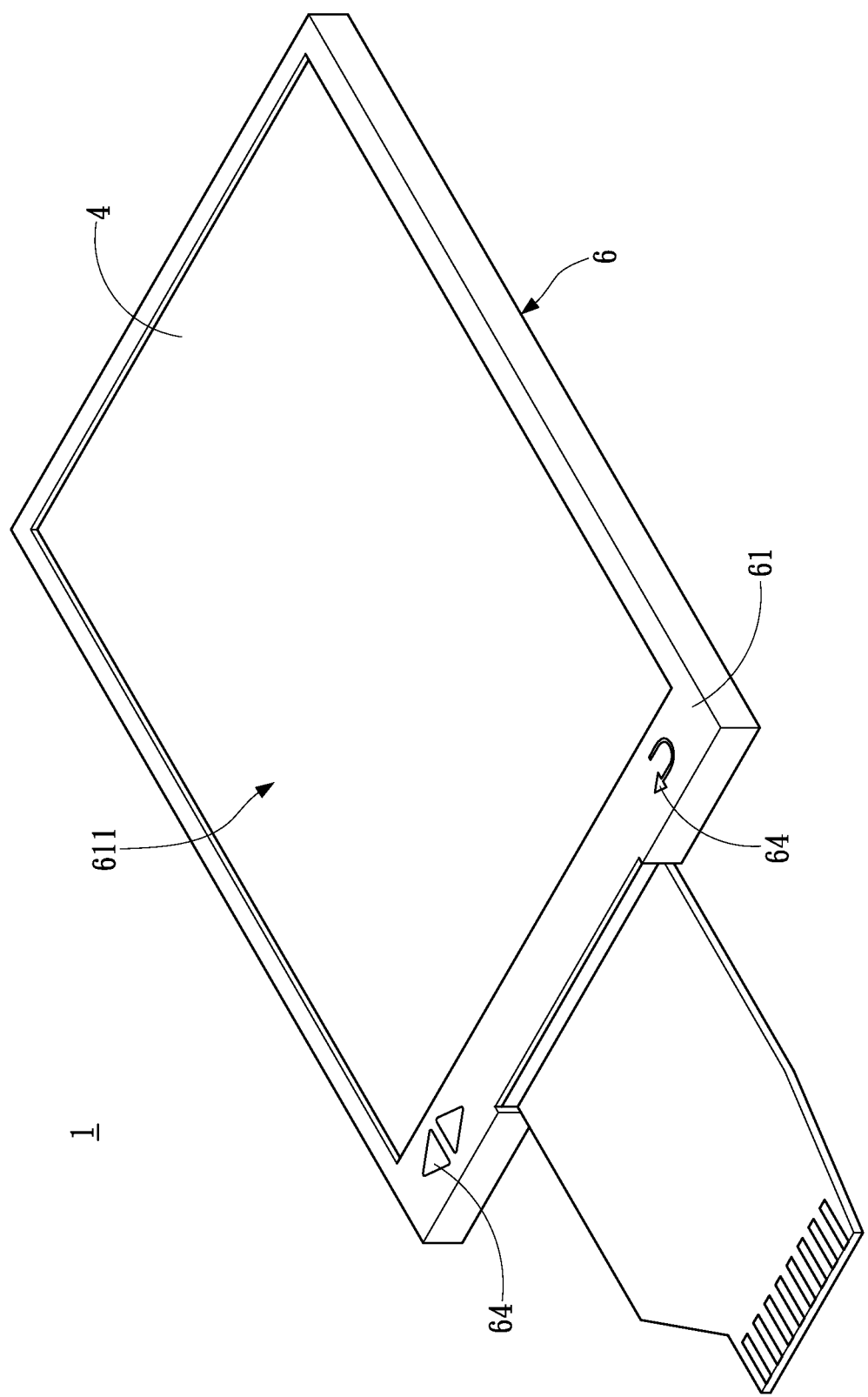
FIG. 3 is a schematic appearance view after assembly according to the first embodiment.
Figure 4A:
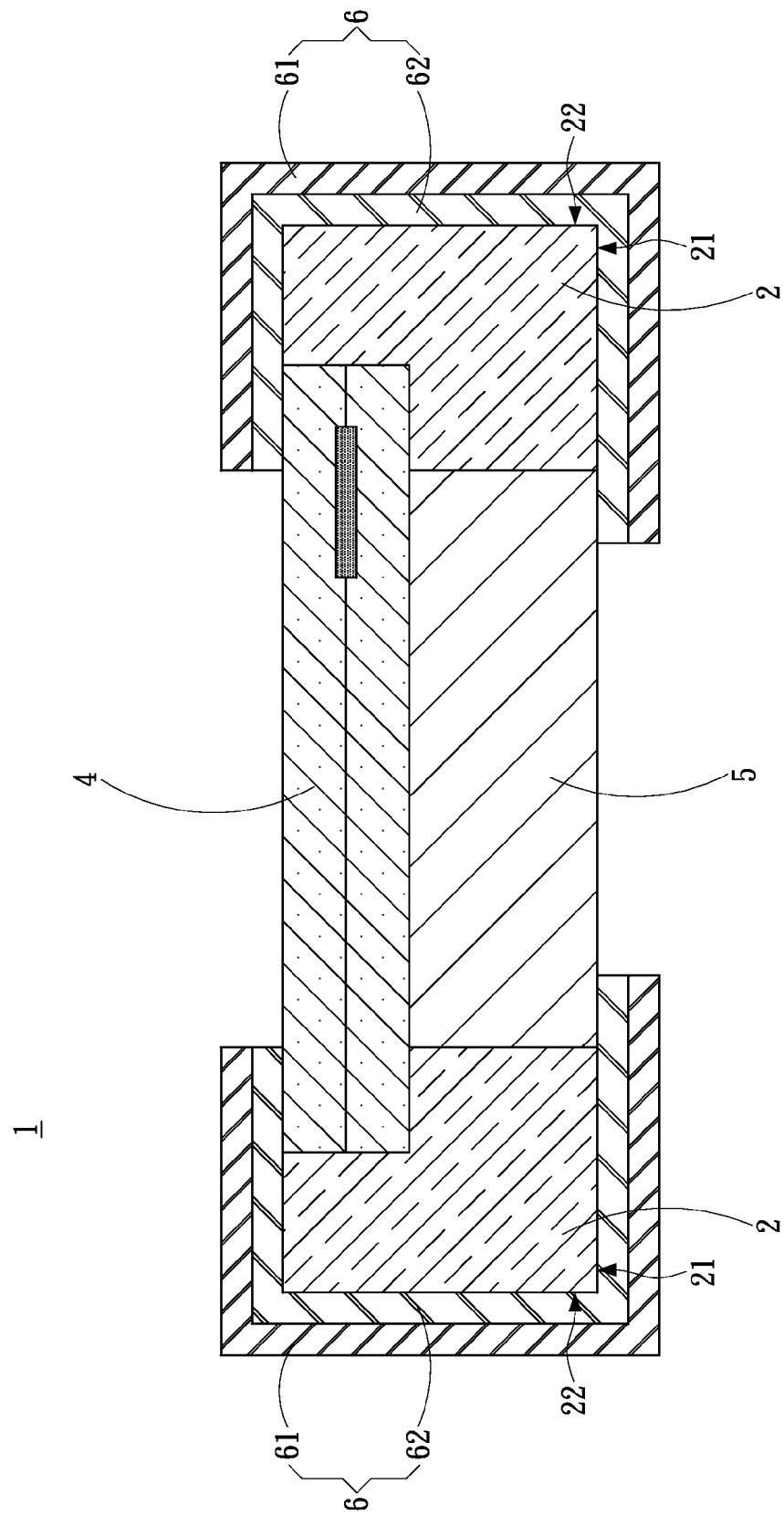
FIG. 4A is a first schematic sectional view according to the first embodiment.

Please refer to FIGS. 2, 3, 4A, 4B, and 4C in combination, a display according to a first embodiment is shown. As shown in FIG. 2, a display 1 in the first embodiment includes a frame 2, a display module 4, and a bendable cover 6. The frame 2 has a bottom surface 21 and a lateral surface 22, and the lateral surface is approximately vertical to the bottom surface 21, as shown in FIG. 4A.

The display module 4 is disposed on the frame 2, and two sides thereof are sandwiched by the frame 2 to locate on the frame 2. Here, the display module 4 may be preferably a flat panel display, such as a thin-film transistor (TFT) display, but the disclosure is not limited thereto.

The bendable cover 6 is formed integrally (as shown in FIG. 2), and mainly includes a surface layer 61 and an adhesive layer 62, wherein the adhesive layer 62 is located on the surface layer 61, and the surface layer 61 has a hollow exposed portion 611 disposed corresponding to the display module 4. In other words, when the bendable cover 6 is fixed between the frame 2 and the display module 4 (as shown in FIG. 3), the display module 4 may be exposed through the exposed portion 611. However, an area of the exposed portion 611 is not limited in the disclosure, and the exposed area of the display module 4 may be selected according to different designs. The adhesive layer 62 may be completely coated on one of the surfaces of the surface layer 61 (as shown in FIG. 4A). A part of the surface layer 61 is adhered to the display module 4 through the adhesive layer 62, a part is adhered to the lateral surface 22 of the frame 2 through the adhesive layer 62, and another part is adhered to the bottom surface 21 of the frame 2 through the adhesive layer 62, so the surface layer 61 is adhered to the display module 4, the lateral surface 22 of the frame 2, and the bottom surface 21 of the frame 2 in sequence, and the display module 4 and the frame 2 are sandwiched between the bendable cover 6. Furthermore, the display 1 in this embodiment further includes a backlight module 5 disposed in the frame 2 and sandwiched between the bendable cover 6. The backlight module 5 has a light source and an optical film (the two elements are conventional members, and are not shown for simplicity), which are used for providing a light ray for using by the display module 4. The disclosure is only described through the display 1 having the backlight module 5, but is not limited thereto. However, according to this embodiment, the bendable cover 6 is formed integrally and the bendable cover 6 can be fixed with the display module 4 and the frame 2 using a single alignment, thus reducing assembly labor hours.

Figure 4B:
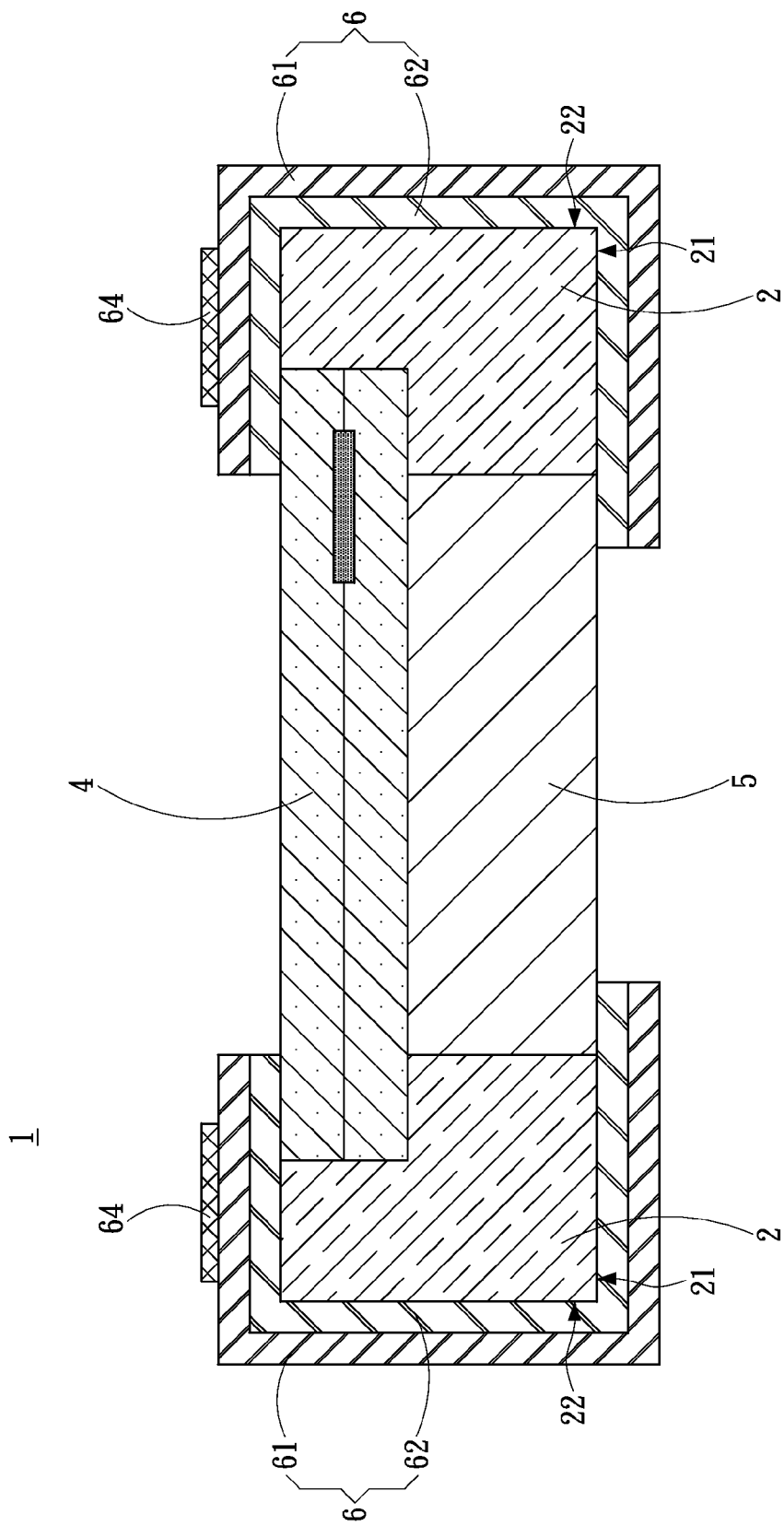
FIG. 4B is a second schematic sectional view according to the first embodiment.
Figure 4C:
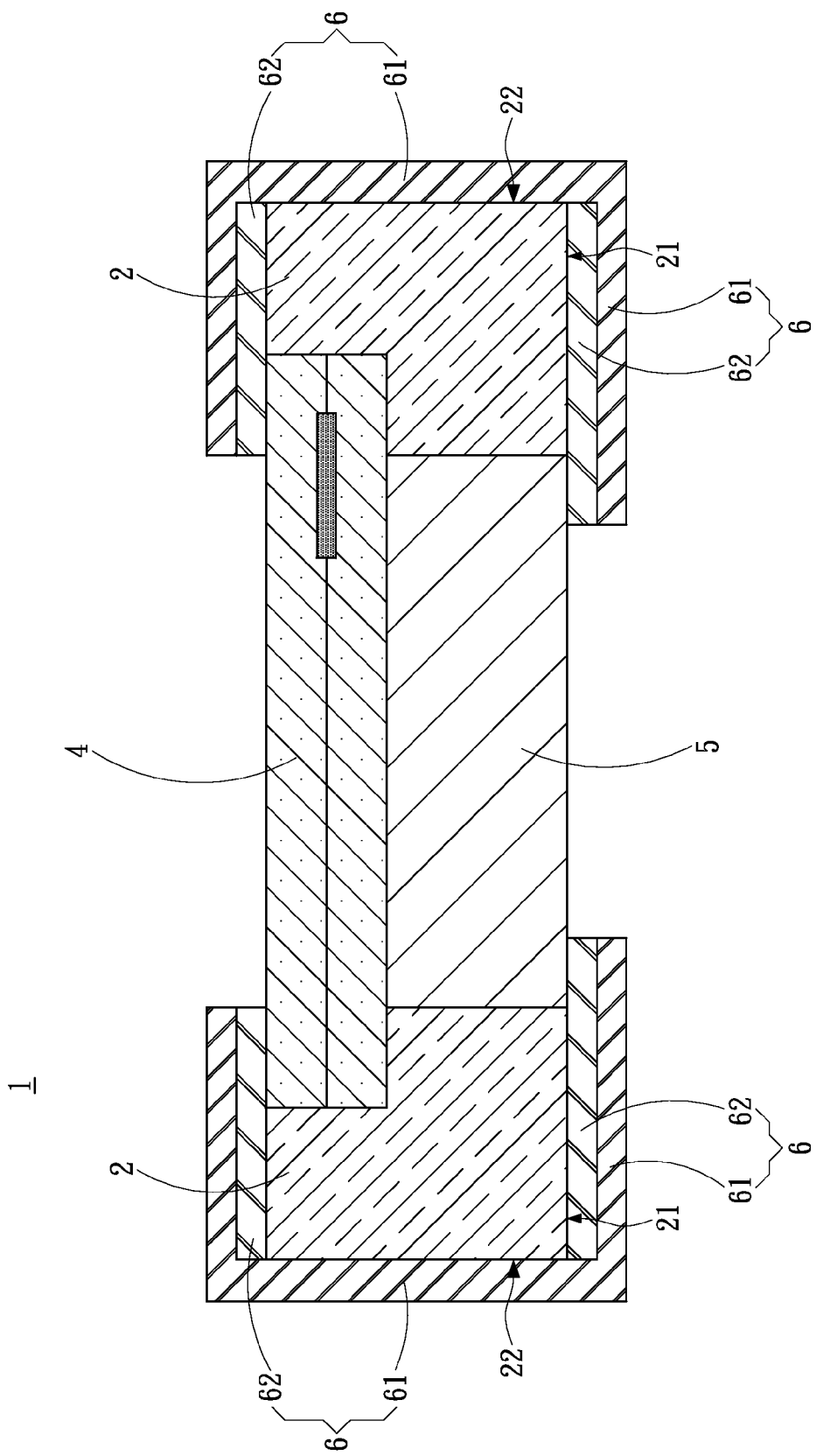
FIG. 4C is a third schematic sectional view according to the first embodiment.

Furthermore, the adhesive layer 62 may be disposed at an appropriate location at one side of the surface layer 61 at intervals (as shown in FIG. 4C), so the surface layer 61 is adhered to the display module 4, the lateral surface 22 of the frame 2, and the bottom surface 21 of the frame 2 in sequence. An end of the surface layer 61 may be adhered to the display module 4 through the adhesive layer 62, the other end may be adhered to the bottom surface 21 of the frame 2 through the adhesive layer 62, and a central part of the surface layer 61 is attached to the lateral surface of the frame 2 and is not adhered to the lateral surface of the frame 2.

Here, the surface layer 61 of the bendable cover 6 may be preferably made from Polyethylene Terephthalate (PET), but the disclosure is not limited thereto, and in another embodiment, other polymer materials may also be used. In this embodiment, the bendable cover 6 may select a material having a characteristic of electric conductivity or light shielding according to practical design requirements, so as to achieve an effect of replacing the conventional upper and lower metallic shell structure. Furthermore, the viscosity of the adhesive layer 62 of the bendable cover 6 is substantially greater than 0.5 kg/25 mm, the thickness of the bendable cover 6 is substantially from 0.04 mm to 0.2 mm, and a surface impedance value thereof is below $10^4$ $\Omega/\epsilon$. The value of the viscosity or the thickness is only provided for the purpose of example, but the disclosure is not limited thereto and the user may select and use an appropriate bendable cover 6 according to the material or characteristic of the display module 4 and the frame 2. In this embodiment, the viscosity of the adhesive layer 62 is preferably greater than 0.5 kg/25 mm, since when the viscosity of the adhesive layer 62 is insufficient warp occurs when the bendable cover 6 is fixed on the display module 4 and the frame 2; that is to say, the bendable cover 6 may not completely cover the display module 4 and the frame 2, so a fixation effect is impaired, and contamination from dust and water vapor may result easily. At the same time, the thickness of the bendable cover 6 is optimally between 0.04 mm to 0.2 mm. The fixation effect of the bendable cover 6 is impaired if the thickness is insufficient, and when the thickness is too large it is difficult to form the bendable cover 6 by bending, impairing convenience of assembly. The bendable cover 6 must have a certain electric conductivity in order to provide electrostatic protection. Furthermore, the bendable cover 6 may dispose a dotted or linear perforation line at preset locations, so that the user may bends the bendable cover 6 easily along the perforation line. Additionally, the bendable cover 6 may be transparent, translucent, or opaque colors, such as white and black, so as to have different light shielding effects with different colors.

Please refer to FIGS. 3 and 4B, in which a printing portion 64 may be disposed on the surface layer 61 of the bendable cover 6, in which the printing portion 64 is disposed on a side of the surface layer 6 on which the adhesive layer 62 is not disposed, and may include text, patterns, patterns, and colors, which can be used to enhance the beauty of a visual effect and used as operating instructions. Furthermore, the printing portion 64 is also used for controlling the light shielding characteristic of the bendable cover 6. When the material selected for the surface layer 61 cannot achieve an expected light shielding effect, the printing portion 64 may be disposed on the surface layer 61 using the methods of coating, printing or film coating, so as to increase the light shielding characteristic of the bendable cover 6. However, in this embodiment the surface layer 61 of the bendable cover 6 preferably selects a printable material. The printing portion 64 may be an water-based ink having polymer resin, emulsion, and organic materials, an ultra-violet ink having pigment and photo initiator, an environment-friendly soy ink having soybean oil, pigment, and resin, or an oil-based dye having pigment resin and mineral oil, so the printing portion 64 may be disposed on the surface layer 61 through coating or printing. However, in this embodiment, only a case in which the printing portion 64 is partially disposed on the surface layer 61 is described, but the disclosure is not limited thereto, and the surface layer 61 may be fully disposed with the printing portion 64.

Figure 5A:
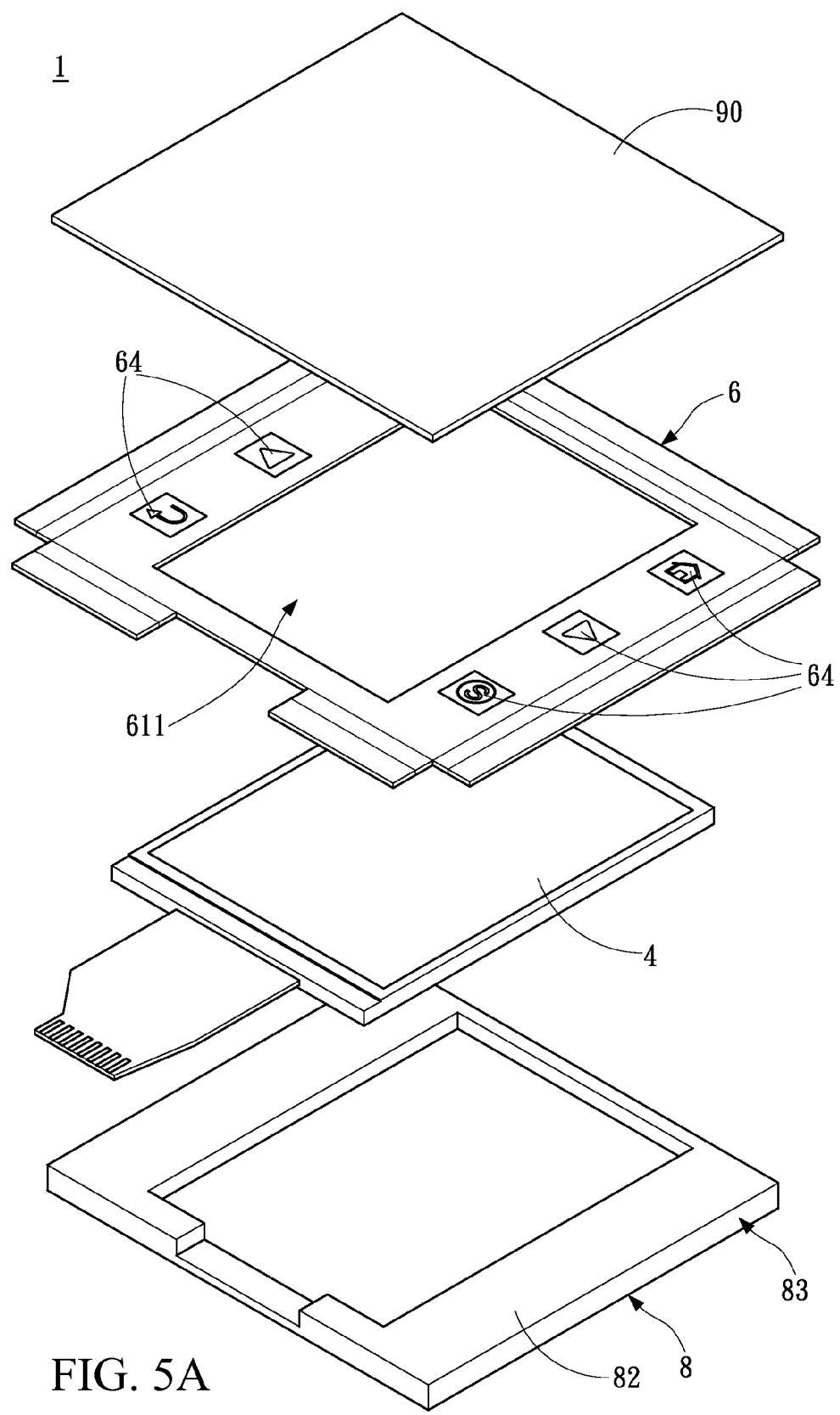
FIG. 5A is a schematic appearance view before assembly according to a second embodiment.
Figure 5B:
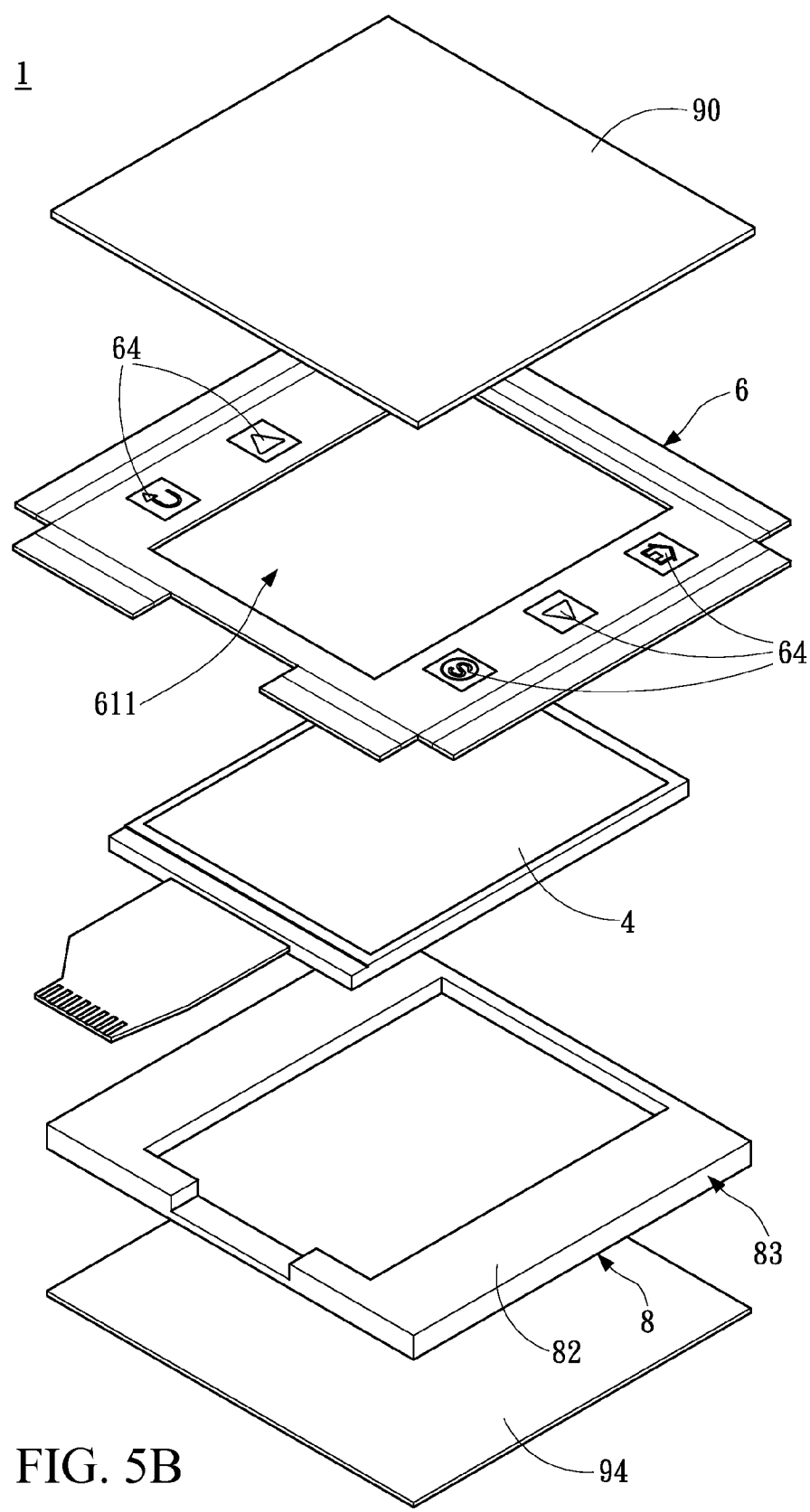
FIG. 5B is a first schematic view of another aspect according to the second embodiment.
Figure 5C:
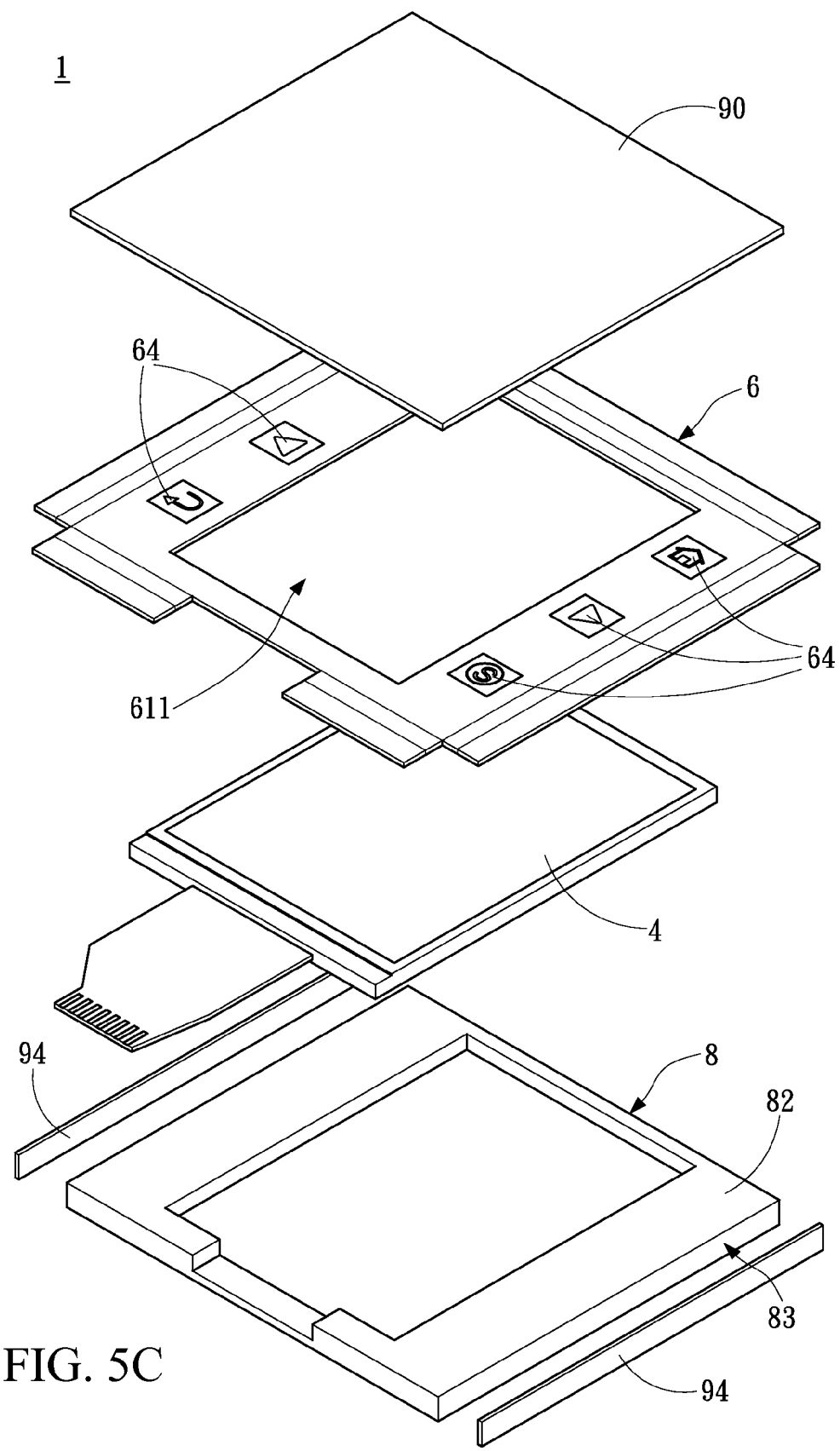
FIG. 5C is a second schematic view of yet another aspect according to the second embodiment.
Figure 6:
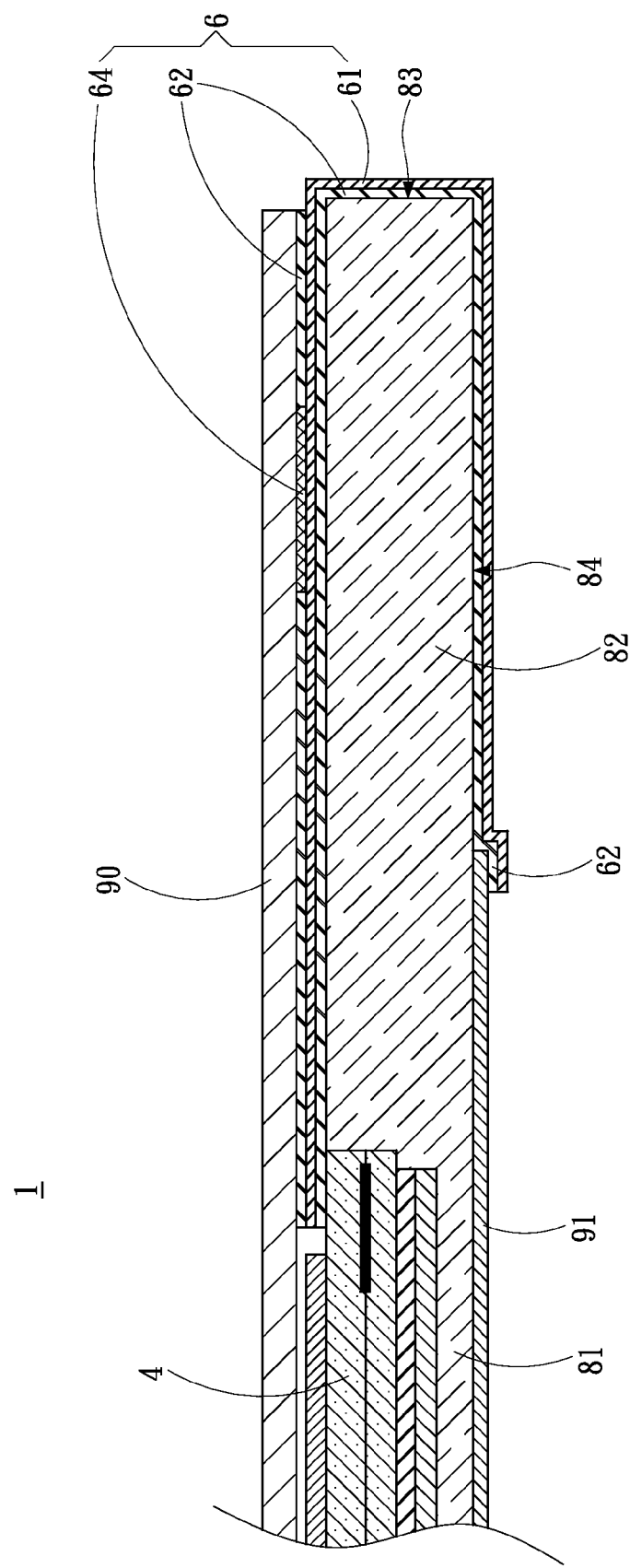
FIG. 6 is a first schematic sectional view according to the second embodiment.
Figure 7:
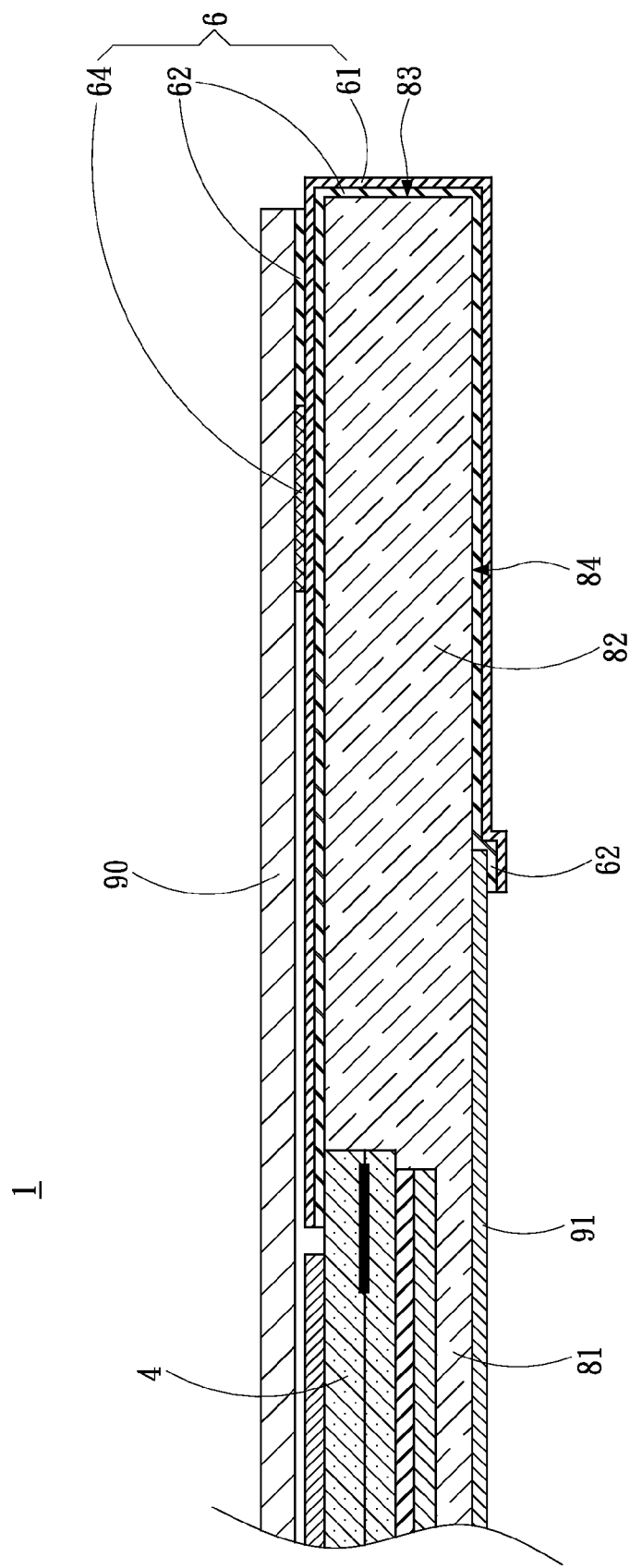
FIG. 7 is a second schematic sectional view according to the second embodiment.

FIGS. 5A, 6, and 7 show a second embodiment. The difference between the second embodiment and the first embodiment is the adhesion manner of a bendable cover 6 and a structure of a light-guiding element 8. In this embodiment, the light-guiding element 8 replaces a frame 2 in the first embodiment, the light-guiding element 8 mainly includes a bearing portion 81, a sidewall 82, and a bottom surface 84, the bearing portion 81 is used for bearing a display module 4, the sidewall 82 has a lateral surface 83 adjacent to the bearing portion 81, and the lateral surface 83 is approximately vertical to the bottom surface 84. In addition, in this embodiment a light source module 94 located below the light-guiding element 8 (as shown in FIG. 5B), is further included, or the light source module 94 is disposed at two sides of the light-guiding element 8 (as shown in FIG. 5C), or any one of the sides, which is used for generating a light ray. In the above description, the location of the light source module 94 is only provided for the purpose of example, but the disclosure is not limited thereto.

In this embodiment a touch panel 90 disposed above the display module 4 and the light-guiding element 8 (as shown in FIG. 6), or in the display module 4 (not shown), is further included; in other words, in the disclosure the disposition location of the touch panel 90 is not limited, and only a case in which the touch panel 90 is disposed above the display module (as shown in FIG. 6), is described, but the touch panel 90 may also be disposed between the light-guiding element 8 and the display module 4.

Furthermore, the bendable cover 6 includes a surface layer 61 and an adhesive layer 62. The surface layer 61 has a light transmissive printing portion 64, the adhesive layer 62 is located on the surface layer 61, the printing portion 64 may be preferably an image used in combination with the touch panel 90 such as a home page, a next page, and a previous page, but the disclosure is not limited thereto.

The surface layer 61 has a hollow exposed portion 611 disposed corresponding to the display module 4. In other words, when the bendable cover 6 is fixed between the frame 2 and the display module 4 (as shown in FIG. 3), the display module 4 may be exposed through the exposed portion 611. However, in the disclosure the area of the exposed portion 611 is not limited, and the exposed area of the display module 4 may be selected according to different designs. The adhesive layer 62 may be coated completely at a side of the surface layer 61 (as shown in FIG. 6), or coated at one of the sides of the surface layer 61 at intervals (as shown in FIG. 7), and the adhesive layer 62 may be coated at an appropriate location on the other side of the surface layer 61. When the display module 4 is disposed on the bearing portion 81 of the light-guiding element 8, a part of the surface layer 61 is adhered to the display module 4 through the adhesive layer 62, a part is adhered to the lateral surface 83 of the sidewall 82 through the adhesive layer 62, and another part is adhered to the bottom surface 84 of the light-guiding element 8 through the adhesive layer 62, so the surface layer 62 is adhered to the display module 4, the lateral surface 83 of the light-guiding element 8, and the bottom surface 84 of the light-guiding element 8 in sequence, and the light-guiding element 8 and the display module 4 are sandwiched between the bendable cover 6. Furthermore, the bendable cover 6 may be adhered on the sidewall 82 through the adhesive layer 61, so as to strengthen a fixation effect of the bendable cover 6, reduce a gap between the bendable cover 6 and the light-guiding element 8 and the display module 4, and further reduce pollution of dust and water vapor. In this embodiment, when the light transmissive printing portion 64 is located on the sidewall 82 and when the touch panel 90 is disposed on the display module 4 and the light-guiding element 8, two sides of the surface layer 61 are coated with the adhesive layer 62. In other words, a side of the surface layer 61 is disposed with the printing portion 64 and the adhesive layer 61, and the other opposite side is disposed with the adhesive layer 61. The adhesive layer 62 is therefore adhered to the bottom surface of the touch panel 90, so the touch panel 90 is fixed on the display module 4 and the light-guiding element 8, and the touch panel 90, the light-guiding piece 8, and the display module 4 may be fixed to each other through the assembly of the bendable cover 6.

In this embodiment, a reflector plate 91 disposed below the light-guiding element 8 is further included, and the reflector plate 91 may be fixed to the light-guiding element 8 through the adhesive layer 62 of the bendable cover 6, so the reflector plate 91 is sandwiched between the bendable cover 6 and the light-guiding element 8, and the light-guiding element 8, the display module 4, the touch panel 90, and the reflector plate 91 may be assembled and fixed to each other using the bendable cover 6 at the same time. However, the disposition location of the reflector plate 91 is not limited thereto, and two sides of the surface layer 61 adhered to the bottom surface 84 may be respectively coated with the adhesive layer 62. A side of the bendable cover 6 is disposed with the adhesive layer 62 so as to affix it to the bottom surface 84, and the other side is also disposed with the adhesive layer 62 to fix the reflector plate 91, so the reflector plate 91 may be fixed below the light-guiding element 8. In other words, the reflector plate 91 and the light-guiding element 8 are respectively disposed at two opposite sides of the bendable cover 6. In this embodiment, when a backlight module (not shown), projects a light source which is reflected by the reflector plate 91 and guided by the light-guiding element 8, a part of a light ray is projected to the printing portion 64 of the bendable cover 6 through the sidewall 82, so as to lighten the printing portion 64 for the user to operate the touch panel 90. In this embodiment, the surface layer 61 may select a material having a light shielding characteristic, and the surface layer 61 below the printing portion 64 is opened with a hole, so the light of the backlight module is transmitted to the printing portion 64 through the hole between the light-guiding element 8 and the surface layer 61, but the disclosure is not limited thereto. The surface layer 61 having a light transmissive characteristic may also be selected, a part requiring light transmission (the printing portion disposed with patterns), may be disposed with light transmitting materials through printing, coating, or film coating, so the surface layer 61 is disposed with the light transmissive printing portion 64, and a part requiring light shielding (the printing portion does not need to be disposed with patterns), may be disposed with the a light shielding material through printing, coating, or film coating, so the surface layer 61 is disposed with the light shielding printing portion 64, in other words, the surface layer 61 may be disposed with partially light shielding or partially light transmissive printing portion 64. In addition, the bendable cover 6 may not be printed with images but a light transmissive area is formed at the printing portion 64, so a light ray is projected to the light transmissive area of the bendable cover 6 through the sidewall 82 to lighten the light transmissive area. Alternatively, the light transmissive area is formed on the bendable cover 6 by forming holes on the surface layer 61, reducing the thickness or selecting a light transmissive material and a partial, full or multi-area light transmissive area may be formed on the bendable cover 6. However, it should be noted that the light transmissive and light shielding characteristics of the adhesive layer 62 may be selected according to different design requirements, for example, the light transmissive area must select the adhesive layer 62 having the light transmissive characteristic.

According to the disclosure, the bendable cover is bent to cover the display module, the frame or the light-guiding element, and the bendable cover replaces the conventional upper and lower metallic shell structure to fix the display module and other elements. In this way, the operation of attaching the bendable cover may be performed through automatic equipment, manual assembly time may be saved effectively, the material cost is reduced, and the size and weight of the display may also be reduced. Furthermore, the bendable cover is adhered tightly to the display module, such that no gap exists between them, so as to effectively prevent external dust and water vapor from entering the display. Furthermore, according to the disclosure, the structures of the conventional frame and the light-guiding plate are integrated to form a light-guiding element, the printing portion is disposed on the bendable cover, and a light ray is guided to the printing portion of the bendable cover through the light-guiding piece, simplifying the display structure, and reducing the mold opening cost of the frame and product cost.

While the disclosure has been described by the way of example and in terms of the preferred embodiments, it is to be understood that the invention need not to be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A display, comprising:
 a frame, comprising a bottom surface and a lateral surface;
 a display module, disposed on the frame; and
 a bendable cover, comprising:
  a surface layer with a first side and a second side;
  a printing portion located on the first side of the surface layer; and
  an adhesive layer located on the second side of the surface layer;
 wherein a part of the surface layer is adhered to the display module through the adhesive layer, another part of the surface layer is adhered to the lateral surface of the frame and adhered to the bottom surface of the frame through the adhesive layer, and the frame is fully enclosed by the bendable cover.

2. The display according to claim 1, wherein the surface layer is adhered to the lateral surface of the frame through the adhesive layer.

3. The display according to claim 1, wherein the surface layer comprises an exposed portion disposed corresponding to the display module.

4. The display according to claim 1, wherein the printing portion is disposed on a side of the surface layer on which the adhesive layer is not disposed.

5. The display according to claim 1, wherein the bendable cover is made of a material having a characteristic of electric conductivity.

6. The display according to claim 1, wherein the bendable cover is made of a material having a characteristic of light shielding.

7. The display according to claim 1, wherein a viscosity of the adhesive layer is substantially greater than 0.5 kg/25 mm.

8. The display according to claim 1, wherein a thickness of the bendable cover is substantially from 0.04 mm to 0.2 mm.

9. A display, comprising:
 a frame, comprising a bottom surface and a lateral surface;
 a display module, disposed on the frame; and
 a bendable cover, comprising:
  a surface layer made of a material having a characteristic of light shielding;
  a printing portion located on a first side of the surface layer; and
  an adhesive layer located on a second side of the surface layer;
 wherein a part of the surface layer is adhered to the display module through the adhesive layer, another part of the surface layer is adhered to the lateral surface of the frame and adhered to the bottom surface of the frame through the adhesive layer, and the frame is fully enclosed by the bendable cover.

10. A display, comprising:
 a frame, comprising a bottom surface and a lateral surface;
 a display module, disposed on the frame; and
 a bendable cover, formed integrally, comprising:
  a surface layer;
  a printing portion located on a first side of the surface layer; and
  an adhesive layer located on a second side of the surface layer;
 wherein a part of the surface layer is adhered to the display module through the adhesive layer, another part of the surface layer is adhered to the lateral surface of the frame and adhered to the bottom surface of the frame through the adhesive layer, and the frame is fully enclosed by the bendable cover.

11. The display according to claim 1, wherein the bendable cover comprises linear perforation lines and the bendable cover is bent along the linear perforation lines to cover the frame and the display module.

12. The display according to claim 1, wherein the printing portion comprises an image corresponding to a button, and a touch sensor is disposed between the printing portion and the display module.

* * * * *